(12) United States Patent  
Hopkins et al.

(10) Patent No.: US 7,015,703 B2  
(45) Date of Patent: Mar. 21, 2006

(54) RADIO FREQUENCY LANGMUIR PROBE

(75) Inventors: Michael Hopkins, Dublin (IE); Paul Heynen, Dublin (IE)

(73) Assignee: Scientific Systems Research Limited, Dublin (IE)

( * ) Notice: Subject to any disclaimer, the term of this patent is extended or adjusted under 35 U.S.C. 154(b) by 0 days.

(21) Appl. No.: 10/837,396

(22) Filed: Apr. 30, 2004

(65) Prior Publication Data

US 2005/0035770 A1 Feb. 17, 2005

(30) Foreign Application Priority Data

Aug. 12, 2003 (IE) ................................. 2003/0593

(51) Int. Cl.  
*G01R 27/28* (2006.01)

(52) U.S. Cl. ..................................... 324/655; 324/464

(58) Field of Classification Search ........... 315/111.21; 324/464, 655, 754, 765  
See application file for complete search history.

(56) References Cited

U.S. PATENT DOCUMENTS

| 5,339,039 | A | 8/1994 | Carlile et al. |
| 6,189,483 | B1 * | 2/2001 | Ishikawa et al. ......... 118/723 E |
| 6,553,853 | B1 * | 4/2003 | Marsh et al. .............. 73/866.5 |
| 6,653,852 | B1 * | 11/2003 | Benjamin .................... 324/754 |
| 6,861,844 | B1 * | 3/2005 | Verdeyen et al. ........... 324/464 |
| 6,894,474 | B1 * | 5/2005 | Cox et al. ................... 324/71.1 |

OTHER PUBLICATIONS

Paranjpe, et al., "A tuned Langmuir probe for measurements in rf glow discharges," J. Appl. Phys. vol. 67, No. 11, pp. 6718-6727 (Jun. 1, 1990).

* cited by examiner

*Primary Examiner*—Walter Benson  
(74) *Attorney, Agent, or Firm*—Kilpatrick Stockton LLP; David M. Krasnow

(57) ABSTRACT

A Langmuir probe for measuring characteristics of a plasma driven by radio frequency (RF) power comprises an elongated conductor 10 having an exposed tip 1 for insertion into an RF plasma and an outer end 3 for connection to external measuring circuitry. In order to reduce distortion over a range of RF frequencies, the probe includes an RF voltage divider 11, 12, 13, 14 in series between the tip and outer end of the conductor.

6 Claims, 6 Drawing Sheets

RADIO FREQUENCY LANGMUIR PROBE

CROSS REFERENCE TO RELATED APPLICATIONS

This application claims priority to Irish Patent Application No. 2003/0593 filed on Aug. 12, 2003, the contents of which are incorporated by reference herein.

BACKGROUND OF THE INVENTION

1. Field of the Invention

This invention relates to a Langmuir probe for the measurement of plasma characteristics in plasma processing systems operating at radio frequencies (RF). In the present specification, RF means the frequency range from 0.1 to 1000 MHz.

2. Prior Art

Plasma processing is used in many industrial applications including semiconductor device, micro-machines, thin-film and nano-technology fabrication. These industrial plasmas are created by applying power to a typically rarefied gas mixture in a confined reactor. The plasma consists of ions, electrons, radical gas species and neutral gas, all of which permit the desired reaction to proceed. A substrate to be processed is located in the plasma reactor according to various configurations. Power is also applied in various configurations, depending on the particular process. A typical plasma process uses power applied at radio frequencies, the advantages being process efficiency and the ability to process dielectric substrates.

In the design of either the plasma reactor or the plasma process it is instructive to know key plasma characteristics such as electron density and temperature, ion density, electron energy distribution, plasma potential and floating potential. One device that has been used extensively to measure these plasma characteristics is the Langmuir probe.

Essentially, a Langmuir Probe consists of a short thin metal wire inserted into the bulk plasma. By applying a voltage to this wire and measuring the resultant drawn current, it is possible to construct a current-voltage (I-V) curve characteristic of the plasma. From the I-V characteristic, plasma parameters such as plasma floating potential, plasma potential, electron temperature, electron number density, electron energy distribution function and ion density are derived. The Langmuir probe can be moved in any direction in the plasma and used to build a map of these fundamental plasma characteristics. This information is of great benefit to scientists and engineers with an interest in characterising plasma processes or optimising the design of either the plasma reactor or the plasma process. Conventionally, Langmuir probes as described above have been used to measure plasma characteristics in direct current (DC) powered plasma.

However, since many industrial applications employ RF powered plasmas, techniques have evolved to modify the simple Langmuir probe. This is necessary since the simple Langmuir probe assumes a stationary plasma potential, whereas in the RF powered plasma the plasma potential varies at the frequency of the driving power. Using a simple Langmuir probe in an RF plasma results in a distorted I-V characteristic with associated errors in the inferred plasma characteristics. Typically, the plasma potential is less distinct, the floating potential and electron density are underestimated, and the electron temperature is overestimated. The shape of the I-V characteristic is clearly distorted.

Several techniques have been described which attempt to eliminate the error due to the RF interference. For example, one technique, described by Paranjpe et al. "*A tuned Langmuir Probe for measurements in RF glow discharges*", in J. Appl. Phys. Vol. 67, pp. 6718, 1990, reduces RF distortion by increasing the impedance of the Langmuir probe at the RF driving frequency. This is done by including a series tuned filter in the probe circuit so that the probe presents a large impedance for the plasma driving frequency. This large impedance between the probe tip and ground ensures that the distorting RF voltage appears between the probe and the reference ground potential and not between the probe tip and the plasma. Minimising the RF distorting voltage between the plasma and the probe tip is key to accurate measurement of the plasma characteristics. For example, to measure an electron temperature of 1 eV, typical of some low pressure RF plasmas, the RF distortion voltage appearing between the probe trip and the plasma should be less than 1V. The RF plasma can vary by hundreds of volts during the RF driving frequency cycle. Therefore the tuned filter must have very high impedance to ensure the RF voltage between the probe tip and plasma is minimised.

Commercially available Langmuir probes for RF plasmas tend to use the tuned filter method, fixing the optimum filter response frequency for the application of interest. FIG. 1 is a schematic cross-section through a typical commercial Langmuir probe for RF plasmas. It comprises an elongated metal conductor 10 having a tip 1 which in use is in direct contact with the plasma, and a rear or outer end 3. The conductor 10 has a tuned filter 4 in series between the tip 1 and the outer end 3. The conductor 10 is surrounded by a hollow tube 2, usually constructed from a dielectric material, which also houses the tuned filter 4. The tube 2 is vacuum sealed at its outer end to the wall 7 of the plasma chamber, and itself contains a vacuum seal 5 to isolate the high vacuum plasma chamber from the ambient atmosphere. Building the tuned filter 4 within the tube 2 avoids capacitive loading to ground via the chamber wall 7. Some commercial RF Langmuir probes use a further extension of the tuned system to decrease the RF distortion effect. This is an RF compensation electrode 6 in contact with the plasma and capacitively coupled to the tip 1. Usually, the compensation electrode is a metallic cylinder which surrounds the inner end of the tube 2. The capacitance is designed to be large enough to effectively shunt the plasma-to-probe tip impedance. Hence a low impedance path from the probe tip to the plasma allows the probe to float at the oscillating plasma potential, further reducing the effect of the RF distortion. In use the outer end 3 of the conductor 10 is connected to external measuring circuitry by which the probe tip 1 is biased through a range of voltages and the resulting current collected to generate the I-V characteristic.

FIG. 2 shows an equivalent circuit model of the prior art RF Langmuir probe and the plasma-probe interface (the plasma-probe interface is the electron-depleted region which surrounds the probe tip 1 in use and separates the tip from the bulk of the plasma). As described above a large RF potential 21 appears at the plasma-probe interface. This interface is represented by capacitance 23 and parallel resistance 24. The existence of the RF potential across this interface causes the RF distortion of the probe's I-V characteristic, generated by varying a DC voltage 22 and measuring the resultant current. The tuned probe and compensation electrode method attempt to reduce the RF distortion by adding a shunt capacitance 26 (the compensation electrode) and a filter 27, consisting of an inductance 28 and parallel tuning capacitance 29, resonant at the RF driving frequency (the compensation electrode capacitance is shown as a single capacitance for simplicity, whereas in reality it consists of the probe-to-electrode capacitance in series with the electrode-to plasma-capacitance). A parasitic capacitance 25 to ground 30 adds to the distortion if the tuned circuit is outside the chamber wall. If the tuned circuit is built within the chamber wall, then the effect of the parasitic capacitance is much less.

Essentially, then, state of art RF Langmuir probes attempt to reduce the effect of the RF distortion by minimising the RF voltage appearing between the plasma and the probe tip. Firstly, the probe-to-ground impedance at the RF driving frequency is increased using the tuned filter. This tuned filter is typically highly resonant at the plasma driving frequency, thereby reducing RF distortion as much as possible. Secondly, the plasma-to-probe impedance is reduced by introducing a capacitive shunt impedance.

A modification of the tuned probe technique is described in U.S. Pat. No. 5,339,039. This system uses a semiconductor FET and parallel capacitor to form the tuned circuit, ensuring optimum tuning for the particular plasma driving frequency.

One disadvantage of the tuned probe systems as described is that the system is tuned to operate at a particular frequency, namely the RF plasma driving frequency. The system must be modified to operate in a plasma using a different driving frequency. Also, many RF plasma now utilise dual frequency RF power, so that the probe as described cannot be used, since the resonance point of the filter is tuned only to a single frequency.

Another disadvantage is the difficulty in designing and optimising the tuned filter. In one commercial system, the tuned filter is a self-resonant inductor, i.e. the inductor has a resonance with the self-capacitance of the inductor windings close to a desired frequency. One known disadvantage of this system is that the inductor has a low current rating thereby limiting the operating plasma density.

There is a need therefore for a Langmuir probe system capable of measuring plasma characteristics at a range of RF driving frequencies and also in plasma systems driven by more than one frequency.

SUMMARY OF THE INVENTION

Accordingly, the present invention provides a Langmuir probe for measuring characteristics of a plasma driven by radio frequency (RF) power, the probe comprising an elongated conductor having an exposed tip for insertion into an RF plasma and an outer end for connection to external measuring circuitry, and an RF voltage divider in series between the tip and outer end of the conductor.

In a preferred embodiment, the voltage divider comprises at least two impedances, preferably inductors, in series and respective shunt capacitances.

In such embodiment, the conductor is surrounded by a hollow dielectric tube, the impedances being located within the tube in series with the conductor and the capacitances being in the form of electrodes on the outside surface of the tube, the impedances and electrodes alternating in the longitudinal direction of the tube.

This invention provides several advantages over the existing known methods. Firstly, the voltage between the plasma and the probe will be low over a wide frequency range so that the probe can be used for multiple frequencies without relying on the designed series filter resonance. Secondly, the probe can be used in systems that employ multiple frequencies without the necessity of designing networks with multiple resonant points. Thirdly, there is no requirement to rely on a tuned filter to reduce RF distortion. The low current rating of some of these tuned filters is thus avoided.

BRIEF DESCRIPTION OF THE DRAWINGS

An embodiment of the invention will now be described, by way of example, with reference to the accompanying drawings, wherein.

In the figures the same reference numerals have been used for the same or equivalent components.

DETAILED DESCRIPTION OF A PREFERRED EMBODIMENT

Figure 1:
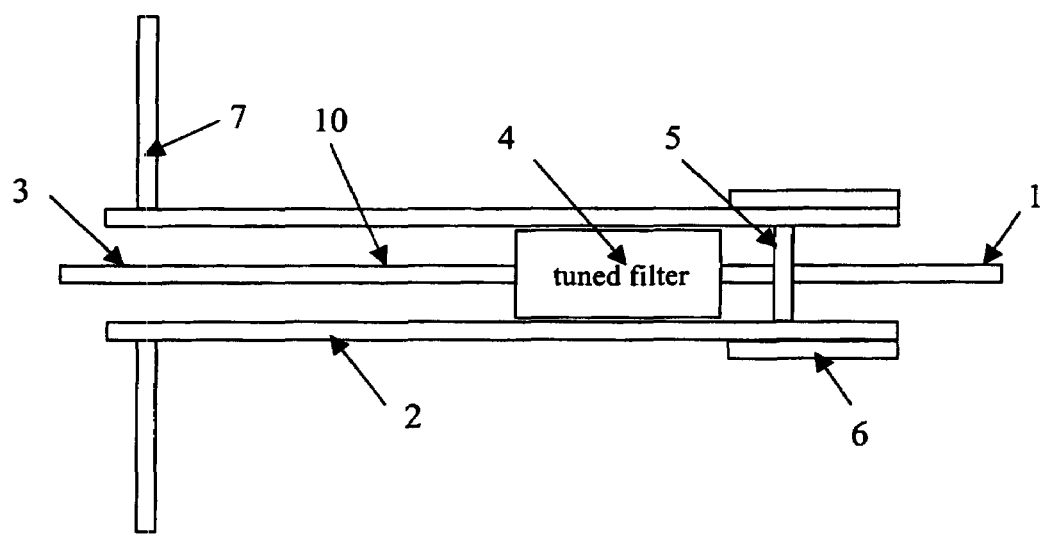
FIG. 1 is a schematic cross-section through a typical prior art RF Langmuir probe.
Figure 2:
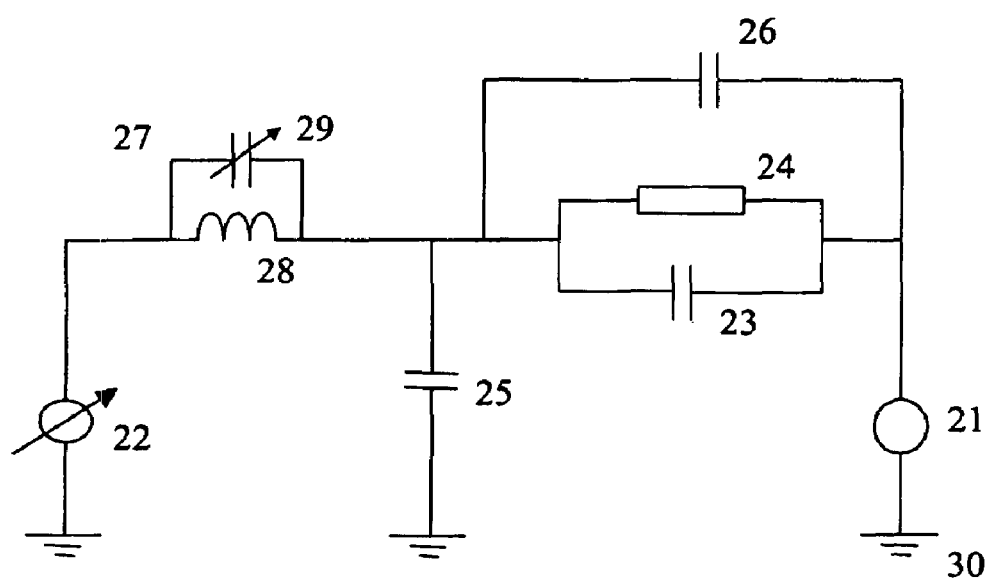
FIG. 2 shows an equivalent electrical circuit of the prior art RF Langmuir probe.
Figure 3:
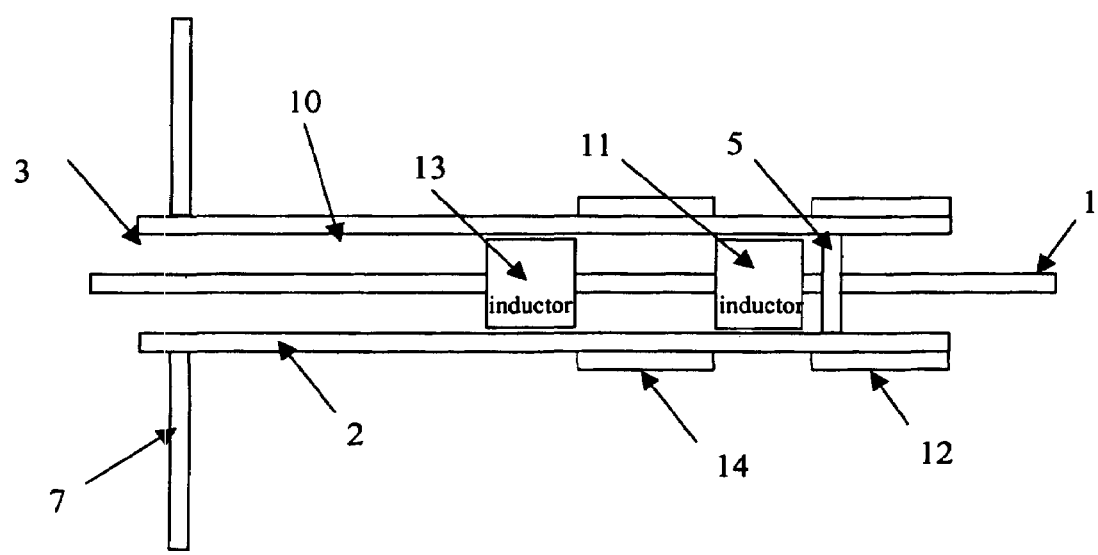
FIG. 3 is a schematic cross-section through an embodiment of RF Langmuir probe according to the present invention.

Referring to FIG. 3, the conductor 10 with probe tip 1 and outer end 3, the surrounding dielectric tube 2 and vacuum seal 5 are all as before. In the present embodiment, however, an RF voltage divider is connected in series between the tip 1 and outer end 3 of the conductor 10. The RF voltage divider comprises a first inductor 11 and capacitor 12 in series with at least one other inductor 13 and capacitor 14. The inductors 11 and 13 are located within and spaced apart in the longitudinal direction of the tube 2 in series with the conductor 10, while the capacitors 12 and 14 are in the form of electrodes which are disposed on the outside of, and surround, the tube 2. The inductors 11, 13 and electrodes 12, 14 alternate in the longitudinal direction of the tube 2, as seen in FIG. 3.

This voltage divider effectively reduces the RF potential appearing between the probe tip and the plasma across a very broad range of frequencies. Essentially, the effect of this circuit arrangement is that the filters do not need to be tuned to any particular frequency and the RF distortion is minimised across a broad frequency range. The inductors do not typically have any DC current limitation prescribed by the self-resonant requirement of the tuned filter method.

The only requirement of the inductors is that they should provide high impedance across a broad frequency range of interest. There is no requirement for resonance to amplify impedance at a particular frequency. In the present embodiment, inductance values of 100 $\mu$H are used. The electrodes 12 and 14 are metallic as before and capacitance is determined by area and plasma characteristics.

Figure 4:
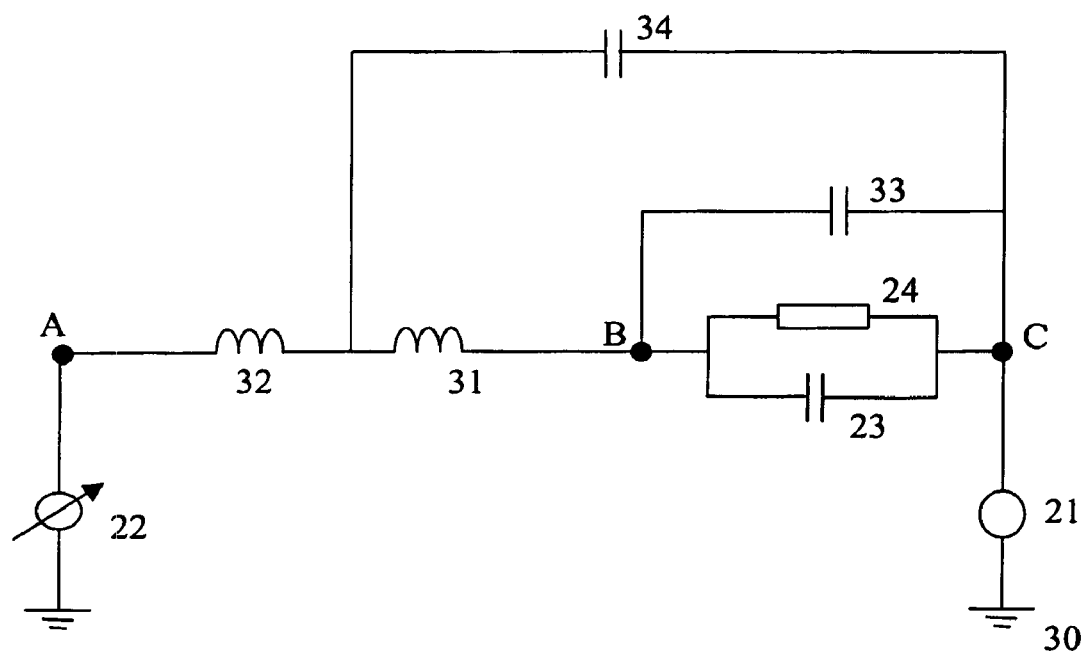
FIG. 4 shows an equivalent electrical circuit of the RF Langmuir Probe of FIG. 3.

An equivalent circuit of the RF Langmuir probe of FIG. 3 and the plasma-probe interface is shown in FIG. 4. The RF plasma potential 21, probe scanning voltage 22, plasma-probe sheath capacitance 23 and resistance 24 and ground reference 30 are as before. However, the prior art shunt capacitance and tuned filter are replaced with two series inductors 31 and 32 and two shunt capacitors 33 and 34 in the configuration shown. This configuration is essentially an RF voltage divider.

Figure 5:
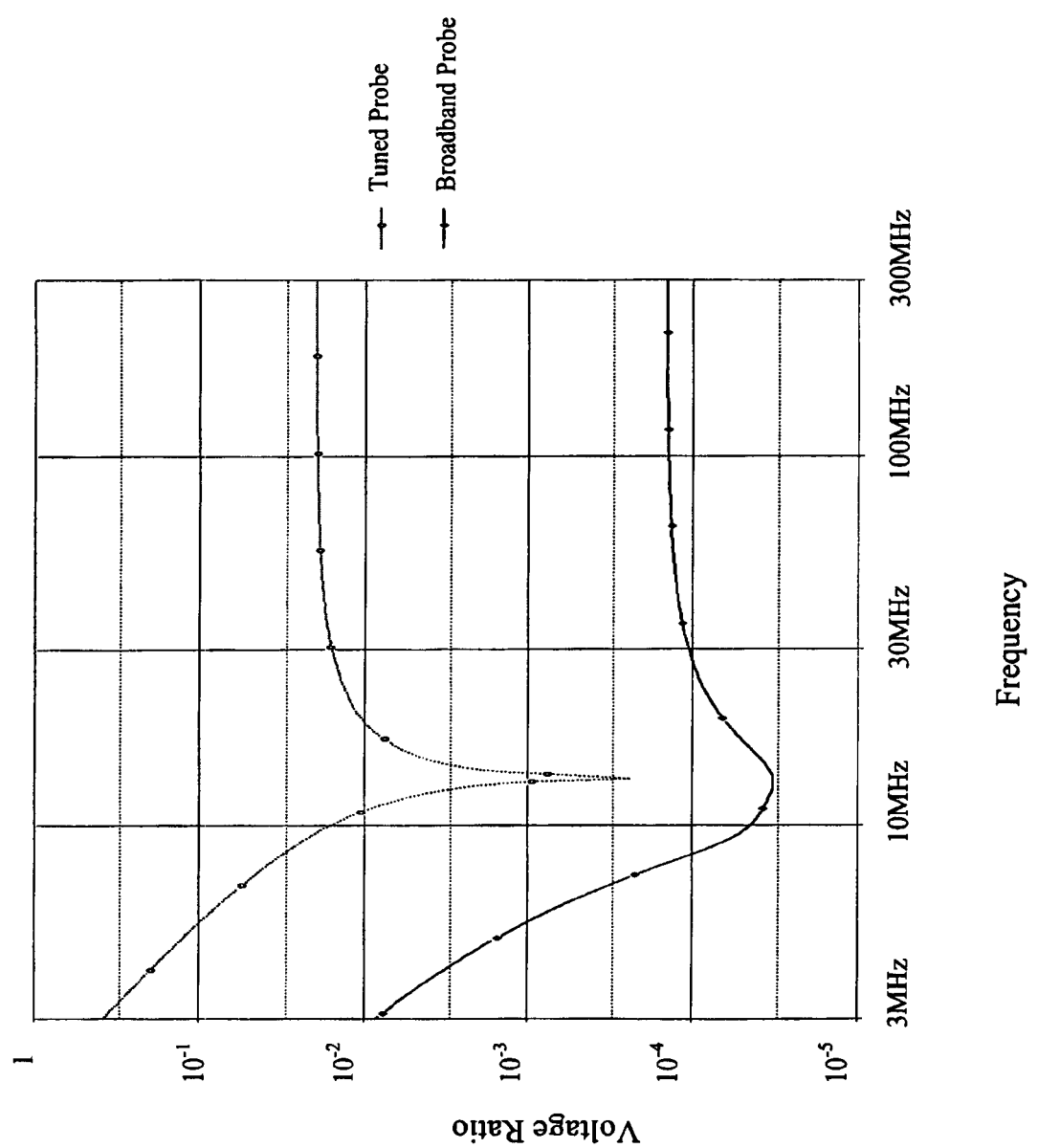
FIG. 5 shows the voltage ratio across the divider network as a function of typical plasma driving frequencies.

The voltage divider provides a high impedance across a very broad range rather than only at the plasma driving frequency. FIG. 5 shows the ratio of the plasma-probe voltage and probe-ground voltage divider circuit for a typical range of RF plasma driving frequencies. The RF voltage between nodes B and C is divided by the voltage between nodes A and B, and the RF potential is simulated at 1000V peak-to-peak. The requirement that the RF potential appearing across the plasma-probe interface be minimised is satisfied for a broad frequency range. The requirement for removing RF distortion of the probe I-V characteristic is now achieved over a broad range of frequencies. This data is generated using typical values of voltage divider for a probe to operate in this region. The range can be altered by changing the voltage divider component values. The RF Langmuir probe can therefore be used in many different plasma driving frequency configurations as well as in systems with more than one unique driving frequency. In particular, the probe can be used (a) to measure plasma characteristics in a plasma system having a variable RF driving frequency, (b) to measure plasma characteristics in a plasma system having a plurality of different RF driving frequencies, or (c) to measure plasma characteristics in different plasma systems having different RF driving frequencies.

Figure 6:
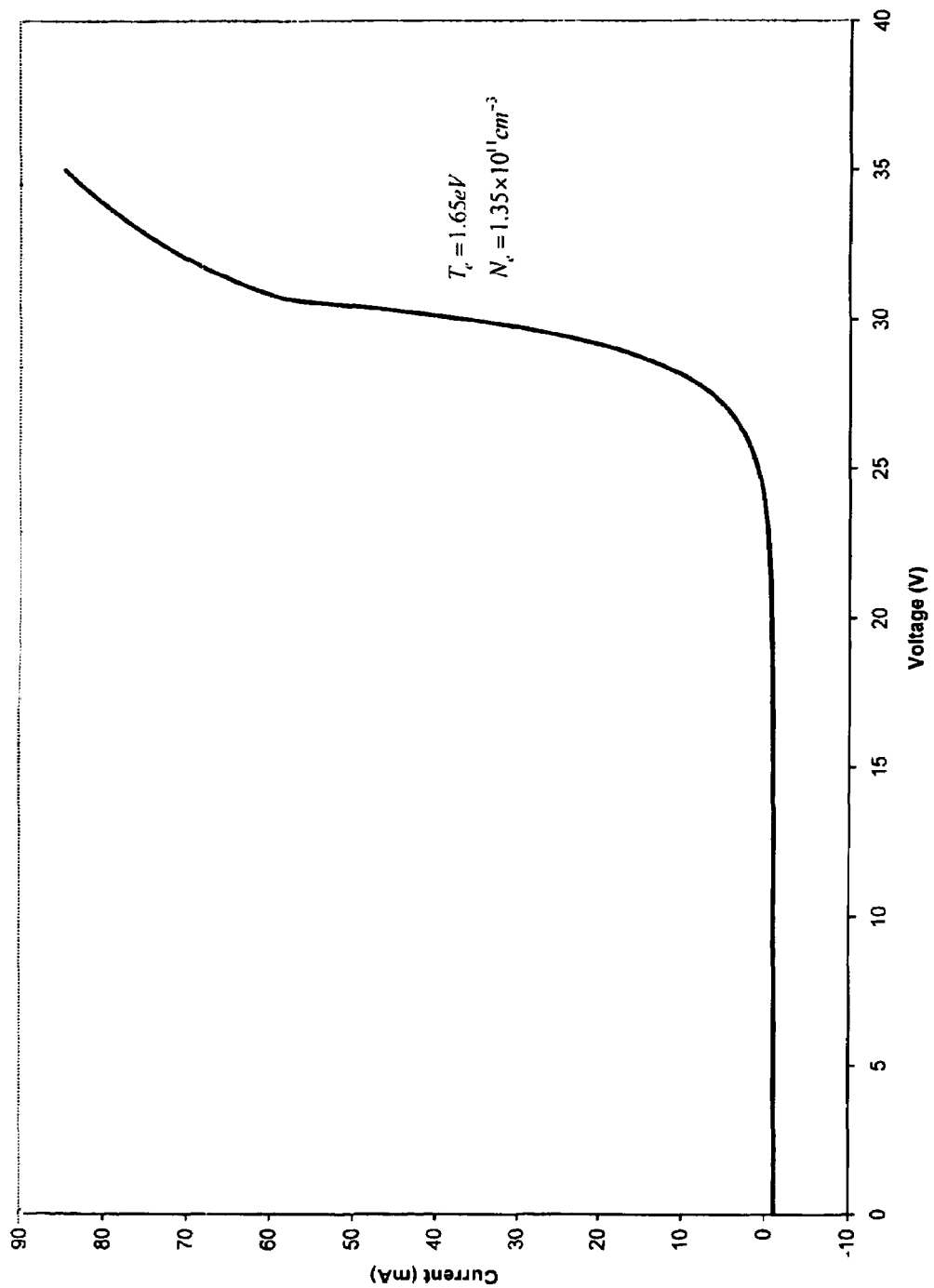
FIG. 6 shows experimental results from the Langmuir probe according to the embodiment of the invention on a plasma simultaneously driven at two different frequencies.

For example, FIG. 6 shows data using the present embodiment collected in an RF plasma simultaneously driven by 2 MHz and 27 MHz RF generators. Despite the multiple RF driving frequencies, this looks like a typical Langmuir probe characteristic obtained from a single driving frequency plasma. The derived electron temperature is 1.65 eV and the plasma density is $1.35 \times 10^{11}$ cm$^{-3}$. From the shape of the I-V characteristic, the distinct plasma potential "knee" and the values reported, there is no apparent RF distortion at either frequency.

It is to be understood that the described embodiment using two electrode/inductor pairs to form the voltage divider may be extended to more than two pairs. Also, the inductors 11, 13 could be replaced by resistors. What is required is high impedance at RF frequencies.

The invention is not limited to the embodiment described herein and may be modified or varied without departing from the scope of the invention.

What is claimed is:

1. A Langmuir probe for measuring characteristics of a plasma driven by radio frequency (RF) power, the probe comprising an elongated conductor having an exposed tip for insertion into an RF plasma and an outer end for connection to external measuring circuitry, and an RF voltage divider in series between the tip and outer end of the conductor, wherein the conductor is surrounded by a hollow dielectric tube, and wherein the voltage divider comprises at least two impedances disposed in series with the conductor and respective shunt capacitances, at least one impedance being located within the tube and at least one capacitance being in the form of an electrode on an outside surface of the tube, the impedances and capacitances alternating in the longitudinal direction of the tube.

2. A Langmuir probe as claimed in claim 1, wherein the impedances are inductors.

3. A Langmuir probe as claimed in claim 1, wherein the electrodes surrounds the tube.

4. A method of measuring plasma characteristics in a plasma system having a variable RF driving frequency comprising: providing a Langmuir probe according to claim 1, inserting said exposed tip of said probe into a plasma generated by a plasma system, applying a voltage to said conductor of said probe, and measuring the current at said outer end of the conductor.

5. A method of measuring plasma characteristics in a plasma system having a plurality of different RF driving frequencies comprising: providing a Langmuir probe according to claim 1, inserting said exposed tip of said probe into a plasma generated by a plasma system, applying a voltage to said conductor of said probe, and measuring the current at said outer end of the conductor.

6. A method of measuring plasma characteristics in different plasma systems having different RF driving frequencies comprising: providing a Langmuir probe according to claim 1, and performing the following steps for each of said different plasma systems: inserting said exposed tip of said probe into a plasma generated by a plasma system, applying a voltage to said conductor of said probe, and measuring the current at said outer end of the conductor.

* * * * *